United States Patent
Kant et al.

(10) Patent No.: US 11,573,496 B2
(45) Date of Patent: Feb. 7, 2023

(54) METHOD OF REDUCING EFFECTS OF LENS HEATING AND/OR COOLING IN A LITHOGRAPHIC PROCESS

(71) Applicant: ASML Netherlands B.V., Veldhoven (NL)

(72) Inventors: Nick Kant, Ultrecht (NL); Martijn Cornelis Schaafsma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/458,216

(22) Filed: Aug. 26, 2021

(65) Prior Publication Data

US 2022/0050383 A1  Feb. 17, 2022

Related U.S. Application Data

(63) Continuation of application No. PCT/EP2020/052240, filed on Jan. 30, 2020.

(30) Foreign Application Priority Data

Feb. 27, 2019  (EP) .................................. 19159788

(51) Int. Cl.
*G03F 7/20* (2006.01)

(52) U.S. Cl.
CPC .......... *G03F 7/70258* (2013.01); *G03F 7/706* (2013.01); *G03F 7/70191* (2013.01); *G03F 7/70891* (2013.01)

(58) Field of Classification Search
CPC ............. G03F 7/70191; G03F 7/70258; G03F 7/70491; G03F 7/706; G03F 7/70891
See application file for complete search history.

(56) References Cited

U.S. PATENT DOCUMENTS

| 2009/0046260 A1* | 2/2009 | Jansen | G03F 7/70891 |
| | | | 355/30 |
| 2009/0225293 A1* | 9/2009 | Shigenobu | G03F 7/70258 |
| | | | 355/53 |

(Continued)

FOREIGN PATENT DOCUMENTS

| JP | 2009152251 A | 7/2009 |
| JP | 2010186918 A | 8/2010 |

(Continued)

OTHER PUBLICATIONS

Klebanov et al., "The modal-decomposition method in active-mirror control theory," Journal of Optical Technology, vol. 85, No. 5 / May 2018 (6 pgs.).

(Continued)

*Primary Examiner* — Deoram Persaud
(74) *Attorney, Agent, or Firm* — Finnegan, Henderson, Farabow, Garrett & Dunner, LLP

(57) ABSTRACT

A lithographic apparatus comprising a projection system comprising at least one optical component and configured to project a pattern onto a substrate. The lithographic apparatus further comprises a control system arranged to reduce the effects of heating and/or cooling of an optical component in a lithographic process. The control system is configured at least: to select at least one of a plurality of mode shapes to represent a relationship between at least one input in the lithographic process and an aberration resulting from the input and to generate and apply a correction to the lithographic apparatus based on the mode shape.

15 Claims, 5 Drawing Sheets

(56) References Cited

U.S. PATENT DOCUMENTS

| | | | | |
|---|---|---|---|---|
| 2009/0296055 A1* | 12/2009 | Ye | ............................ | G06F 30/00 |
| | | | | 716/54 |
| 2010/0171939 A1* | 7/2010 | Baselmans | .............. | G03F 7/705 |
| | | | | 355/77 |
| 2013/0212543 A1* | 8/2013 | Crouse | ..................... | G03F 7/705 |
| | | | | 716/52 |
| 2015/0049315 A1* | 2/2015 | Hoshino | ............. | G03F 7/70308 |
| | | | | 355/52 |
| 2016/0342097 A1 | 11/2016 | Conradi et al. | | |
| 2017/0357159 A1* | 12/2017 | Kant | ........................... | G03F 7/20 |
| 2018/0259859 A1 | 9/2018 | Kant et al. | | |

FOREIGN PATENT DOCUMENTS

| | | | |
|---|---|---|---|
| JP | 2014509071 A | 4/2014 |
| JP | 2017538156 A | 12/2017 |
| JP | 2018529996 A | 10/2018 |

OTHER PUBLICATIONS

Fang et al., Automated alignment of a reconfigurable optical system using focal-pane sensing and Kalman filtering, Applied Optics, Aug. 29, 2016 (10 pgs.).

International Search Report and Written Opinion issued by the International Searching Authority in related International Patent Application No. PCT/EP2020/052240, dated May 6, 2020 (10 pgs.).

Notification of Reason(s) for Refusal issued in related Japanese Patent Application No. 2021-549967; dated Sep. 6, 2022 (2 pgs.).

\* cited by examiner

METHOD OF REDUCING EFFECTS OF LENS HEATING AND/OR COOLING IN A LITHOGRAPHIC PROCESS

CROSS-REFERENCE TO RELATED APPLICATIONS

This application claims priority of International Application PCT/EP2020/052240, which was filed on Jan. 30, 2020, which claims priority of EP application 19159788.9, which was filed on Feb. 27, 2019, both of which are incorporated herein by reference in their entireties.

FIELD

The embodiments of the present disclosure relate to a method of reducing effects of lens heating and/or cooling in a lithographic process, in particular the effects of lens heating and/or cooling on imaging performance, e.g., overlay and/or focus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate (e.g., a wafer).

In a lithographic apparatus, the dose of radiation received by the projection system causes heating and subsequent cooling of the projection system. Herewith, the projection system induces some aberrations in the projected image, therewith adversely affecting imaging performance, e.g., overlay and/or focus, of the lithographic process.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable the creation of increasingly smaller features. The smaller the features, the greater the need to overcome aberrations in the projected image.

It is known that lens heating effects can be calculated in advance by using mathematical models. These models are helpful in determining (expected) aberrations of the projected image caused by the lens heating effect. With the knowledge of the expected aberration, corrections may be applied by introducing compensating aberrations. These counter measures may be provided by adjustable lens elements arranged in the projection system. Herewith, the effect of lens heating may be at least mitigated.

With increasing demands on imaging performance of a lithographic apparatus, the complexity of the model increases. In an effort to effectively correct for the effects of lens heating, the increasing complexity of the model may result in overfitting, increased numerical effort, and/or erroneous fitting.

One of the objects of the disclosed embodiments is to provide a method of correcting aberrations, which obviates or mitigates a problem associated with conventional systems.

SUMMARY

According to some embodiments, there is provided a lithographic apparatus comprising: a projection system comprising at least one optical component (e.g., a lens and or a mirror) and configured to project a pattern onto a substrate; and a control system arranged to reduce the effects of heating and/or cooling of the at least one optical component in a lithographic process, wherein the control system is configured to select at least one of a plurality of mode shapes to represent a relationship between at least one input in the lithographic process and an aberration resulting from the input and to generate and apply a correction to the lithographic apparatus based on the selected mode shape. A single aberration may be represented, or multiple aberrations may be represented by the selected mode shape.

The aberration or aberrations may affect the performance of the lithographic projection system. An aberration may comprise, for example, a distortion and/or defocus. The use of mode shapes to represent a relationship between at least one input in the lithographic process and an aberration resulting from the input prevents overfitting by reducing the number of parameters required to describe the relationship. The use of mode shapes may be advantageous in reducing the number of measurements required to describe aberrations due to heating and/or cooling of the at least one optical component (lens and or mirror), also known as lens heating/cooling. A mode shape may be a specific lens heating pattern that has its own unique temporal and/or dynamical behaviour. The mode shape may be expressed, for example, in terms of Zernike polynomials or in terms of wavefronts. The plurality of mode shapes may be orthogonal.

The at least one mode shape may be selected from a predetermined set of mode shapes. The predetermined set of mode shapes may be defined as the minimal amount of mode shapes needed to capture heating effects of an optical component, typically phrased as lens heating (which includes mirror heating). The predetermined mode shapes may be generated in advance of the selecting. For example, the predetermined set of mode shapes may be obtained based on processing a first number of object marks. Selection of the at least one mode shape may be based upon processing of a smaller subset of those object marks. Selecting from a set of predetermined mode shapes may advantageously improve processing time, thereby allowing real-time adjustment of the lithographic apparatus, reducing computational load, and/or increasing throughput. The predetermined mode shapes may be selected by modelling, for example FEM modelling, ray tracing modelling, thermo-mechanical modelling, or a combination of modelling techniques. The predetermined mode shapes may be selected by using measurement data. Selection of a predetermined mode shape may be performed prior to patterning a particular batch of substrates. Selection of a predetermined mode shape may be performed on a substrate-by-substrate basis. A predetermined mode shape may be chosen based on inputs, for example lithographic apparatus type, reticle pattern, and/or pupil shape. A selection of mode shapes may be specifically associated with a lithographic application and/or apparatus, and may be selected for the lifetime of that lithographic application and/or apparatus.

The control system may select twenty or fewer mode shapes that can be used to describe the aberrations. Using twenty or fewer mode shapes reduces overfitting. Alternatively, fewer mode shapes, for example ten mode shapes, may be used.

The control system may select six or fewer mode shapes. Using six or fewer mode shapes may robustly describe aberrations in many lithographic applications. Using six or fewer mode shapes may further reduce overfitting.

The at least one input in the lithographic apparatus may comprise a dose of radiation supplied by a radiation source. Alternatively or additionally, the at least one input in the lithographic apparatus may comprise a transmission of an object used in the lithographic apparatus. Alternatively or additionally, the at least one input in the lithographic apparatus may comprise a temperature of at least one optical component in the projection system. The at least one input in the lithographic apparatus may further comprise a wafer stage identifier, a lens identifier (also covering mirrors), a reticle identifier, and/or an identifier for a diffraction pattern resulting from the reticle. In addition, the at least one input in the lithographic apparatus may also comprise data regarding the illumination beam, for example, a polarization state or an inner and/or outer radius. Alternatively or additionally, the at least one input in the lithographic apparatus may comprise representative data of a pressure around the at least one optical component.

The lithographic apparatus may further comprise a sensor configured to measure aberrations. The selected mode shape may be compared to measured aberration data. The comparison between the selected mode shape and the measured aberration data may be used as an input into the control system.

The control system may be further configured to filter data from the at least one input. The filter may be applied to the measured aberration data. The filter may be used to reduce the effect of measurement and/or process noise. The filter may use mode shapes to represent aberrations and/or apply a filter. The filter may be a Kalman filter.

The control system may be calibrated using measurement data. Measurement data may comprise aberration data such as aberrated wavefronts, which are, for example, measured using a sensor arranged in the lithographic apparatus. The aberration data may indicate aberrations that span multiple positions in the exposure slit. The aberrations may be a function of spatial dimensions, such as x,y and Zernike polynomials. Alternatively or additionally, the control system may be calibrated using input data. The input data may comprise, for example, a dose of radiation supplied by a radiation source, transmission (or reflection) of an object, a temperature the at least one optical component, a wafer stage identifier, a lens identifier, data regarding the illumination beam, and/or a lens pressure.

In addition, the control system may be calibrated using data obtained from a model. To model the lens (or mirror) heating effect, a variety of models may be used, including: a finite element model (FEM), a ray tracing model, a thermo-mechanical model, or a combination of modelling techniques. Calibration using measurement data, input data, and/or model data allows the control system to be calibrated for a single optical component and/or for a specific type or group of optical components having a substantially corresponding behaviour. In addition, the calibration may take into account historical data of operation of the lithographic apparatus, for example, by means of a feed-back loop. Alternatively or additionally, the calibration may take into account a prediction of the future state of the lithographic apparatus, for example, by means of a feed-forward loop.

The correction to the lithographic apparatus may be a correction of an alignment of a substrate with respect to the projection system. The correction is provided to improve imaging performance in the lithographic apparatus. For example, the correction may improve overlay and/or focus. The correction may comprise a manipulation of a position of the substrate with respect the projection system. Additionally or alternatively, the correction may comprise the manipulation of at least one optical component of the projection system in the lithographic apparatus. The correction may be a parameter adjustment of at least one optical component (lens and or mirror). Additionally or alternatively, the correction may comprise the provision of heat to at least a part of the at least one optical component.

According to some embodiments, there is provided a method of reducing the effects of heating and/or cooling of at least one optical component (lens and or mirror) of a projection system in a lithographic apparatus. The method comprises the steps of: selecting at least one of a plurality of mode shapes to represent a relationship between at least one input in the lithographic apparatus and an aberration resulting from the input; and generating and applying a correction to the lithographic apparatus based on the mode shape. A single aberration may be represented, or multiple aberrations may be represented. The aberration or aberrations may affect the performance of the lithographic projection system. An aberration may comprise, for example, a distortion and/or defocus.

The use of mode shapes to represent a relationship between at least one input in a lithographic process and an aberration resulting from the input prevents overfitting by reducing the number of parameters required to describe the relationship. The use of mode shapes may reduce the number of measurements required to describe an aberration due to lens heating and/or cooling. A mode shape is a specific lens heating pattern that has its own unique spatial, temporal and/or dynamical behaviour. The mode shape may be expressed in terms of Zernike polynomials or in terms of wavefronts. The plurality of mode shapes may be orthogonal.

Selecting at least one mode shape may be selecting from a predetermined set of mode shapes. The predetermined set of mode shapes may be defined as the minimal amount of mode shapes needed to capture lens heating effects. Selecting from a set of predetermined mode shapes may advantageously improve processing time, thereby allowing real-time adjustment of the lithographic apparatus and/or reducing computational load and/or increasing throughput. The predetermined mode shapes may be selected by modelling, for example FEM modelling, ray tracing modelling, thermo-mechanical modelling or a combination of modelling techniques. The predetermined mode shapes may be selected by using measurement data. Selection of a predetermined mode shape may be performed prior to patterning a particular batch of substrates. Selection of a predetermined mode shape may be performed on a substrate-by-substrate basis. A predetermined mode shape may be chosen based on inputs, for example, lithographic apparatus type, reticle pattern, and/or pupil shape. A selection of mode shapes may be specifically associated with a lithographic application and/or apparatus and may be selected for the lifetime of that lithographic application and/or apparatus.

The predetermined set of mode shapes may be a set of twenty or fewer mode shapes that can be used to describe the aberrations. Using twenty or fewer mode shapes reduces overfitting. Alternatively, fewer mode shapes, for example ten mode shapes, may be used.

The predetermined set of mode shapes may be a set of six or fewer mode shapes. Using six or fewer mode shapes may robustly describe aberrations in many lithographic applications. Using six or fewer mode shapes may further reduce overfitting.

The at least one input in the lithographic process may comprise a dose of radiation supplied by a radiation source. Alternatively or additionally, the at least one input in the lithographic process may comprise a transmission (or reflection) of an object used in the lithographic process. Alternatively or additionally, the at least one input in the lithographic process may comprise a temperature of at least one optical component, a wafer stage identifier, and/or lens identifier (including mirrors). Alternatively or additionally, the at least one input in the lithographic process may comprise data regarding the illumination beam, for example, a polarization state, or an inner and/or outer radius. Alternatively or additionally, the at least one input in the lithographic process may comprise a pressure around the at least one optical component.

The method may further comprise measuring aberrations using a sensor arranged in the lithographic apparatus. The selected mode shape may be compared to measured aberration data. The comparison between the selected mode shape and the measured aberration data may be used as an input into the control system.

The method may further comprise a step of filtering data from the at least one input. Data filtering may be used to reduce the effect of measurement and/or process noise. Data filter may be performed by using a Kalman filter.

Applying a correction is provided to improve imaging performance in the lithographic process. For example, the correction may improve overlay and/or focus. The correction to the lithographic apparatus may be a correction of an alignment of a substrate with respect to the projection system. For example, the correction may comprise a manipulation of a position of the substrate with respect to the projection system. Additionally or alternatively, the correction may comprise the manipulation of at least one optical component of the projection system in the lithographic apparatus. Additionally or alternatively, the correction may be a parameter adjustment of the at least one optical component. Additionally or alternatively, the correction may comprise the provision of heat to at least a part of the optical component.

According to some embodiments, there is provided a non-transitory computer readable medium program comprising computer readable instructions configured to cause a processor to carry out any of the above methods. The computer readable medium may be, for example a tangible carrier medium (e.g., hard disks, CD ROMs, et cetera) or an intangible carrier medium such as communication signals.

According to some embodiments, there is provided a device manufacturing method comprising producing an integrated circuit using the above-described lithographic apparatus. The device manufacturing method may also be used to produce other devices, for example integrated optical systems, and/or guidance and detection patterns for magnetic domain memories, and/or flat-panel displays, and/or liquid-crystal displays (LCDs), and/or thin-film magnetic heads.

BRIEF DESCRIPTION OF THE DRAWINGS

Embodiments of the present disclosure will now be described, by way of example only, with reference to the accompanying schematic drawings in which corresponding reference symbols indicate corresponding parts, and in which.

DETAILED DESCRIPTION

Figure 1:
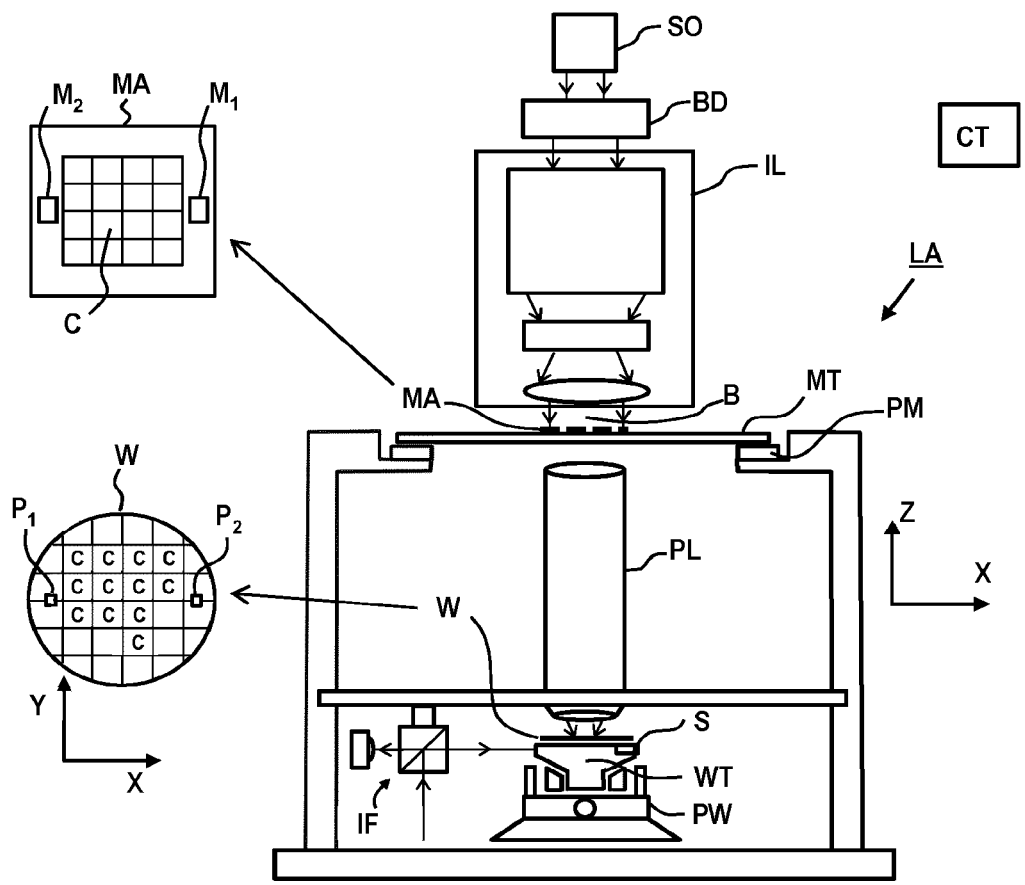
FIG. 1 depicts a schematic overview of a lithographic apparatus, consistent with embodiments of the present disclosure.

FIG. 1 schematically depicts a lithographic apparatus LA according to an example implementation of the disclosed embodiments. The lithographic apparatus LA comprises:
- an illumination system (also referred to as illuminator) IL configured to condition a radiation beam B (e.g., UV radiation, DUV radiation or EUV radiation);
- a mask support (e.g., a mask table) MT constructed to support a patterning device (e.g., a mask) MA and connected to a first positioner PM configured to accurately position the patterning device MA in accordance with certain parameters;
- a substrate support (e.g., a wafer table) WT constructed to hold a substrate (e.g., a resist coated wafer) W and connected to a second positioner PW configured to accurately position the substrate support in accordance with certain parameters; and;
- a projection system (e.g., a refractive or a reflective projection lens system, or a combination thereof) PL configured to project a pattern imparted to the radiation beam B by patterning device MA onto a target portion C (e.g., comprising one or more dies) of the substrate W.

The terms "radiation" and "beam" are used to encompass all types of electromagnetic radiation, including ultraviolet radiation (e.g., with a wavelength of 365, 248, 193, 157 or 126 nm) and EUV (extreme ultra-violet radiation, e.g., having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

The term "projection system" PL used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. The projection system PL may comprise at least one lens. The projection system PL may comprise multiple lens elements, for example disposed between the mask support MT and the substrate support WT. Any use of the term "projection lens" herein may be considered as synonymous with the more general term "projection system" PL. The term "lens" may be used herein as shorthand for "projection lens".

The illumination system may also encompass various types of optical components, including refractive, reflective, and catadioptric optical components for directing, shaping, or controlling the beam of radiation, and such components may also be referred to below, collectively or singularly, as a "lens".

The term "aberration" as employed in this text may be broadly interpreted as encompassing any deviation from the theoretical ideal performance of an optical system. Examples of common aberration are defocus, which may result in image blurring, and/or distortion, which may lead to irregular magnification. An aberration may lead to features printing with smaller dimensions than desired. An aberration may lead to features printing with larger dimensions than desired. An aberration may lead to features printing at an undesired position on the substrate. Aberration may result in errors in overlay and/or focus and/or fading.

Focus aberration, also known as defocus, occurs when light rays do not converge at the desired point. Overlay describes the positional accuracy with which a new lithographic pattern has been printed on top of an existing pattern on the substrate. Fading describes a lack of synchronisation between a reticle and a substrate scan speed, which may be affected by changes in the optical system for example the lens reduction. It should be understood that, while the plural term "aberrations" has been used in this text, this can be considered to be synonymous with "an aberration" as the change in performance of the optical system may be described by a single aberration or a sum of multiple aberrations.

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, for example water, so as to fill a space between the final element of the projection system and the substrate. Immersion techniques are well known in the art for increasing the numerical aperture of projection systems.

As here depicted, the apparatus is of a transmissive type, for example, employing a transmissive mask. Alternatively, the apparatus may be of a reflective type, e.g., employing a reflective mask or programmable mirror array of a type as referred to above.

In some embodiments of the present disclosure, a Cartesian coordinate system is used. The Cartesian coordinate system has three axis, i.e., an x-axis, a y-axis and a z-axis. Each of the three axes are orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting and is used for clarification only. Instead, another coordinate system, such as a cylindrical coordinate system, may be used. The orientation of the Cartesian coordinate system may be different, for example, such that the z-axis has a component along the horizontal plane.

Referring to FIG. 1, the illuminator IL receives a radiation beam from a radiation source SO. The source and the lithographic apparatus may be separate entities, for example when the source is an excimer laser. In such cases, the radiation source SO is not considered to form part of the lithographic apparatus and the radiation beam is passed from the radiation source SO to the illuminator IL with the aid of a beam delivery system BD including, for example, suitable directing mirrors and/or a beam expander. In other cases, the source may be an integral part of the lithographic apparatus, for example when the source is a mercury lamp. The radiation source SO and the illuminator IL, together with the beam delivery system BD if required, may be referred to as a radiation system.

The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

In addition to the substrate support WT, the lithographic apparatus LA may comprise a measurement stage. The measurement stage is arranged to hold for example a sensor. The sensor may be arranged to measure a property of the projection system PL or a property of the radiation beam B. The measurement stage may hold multiple sensors. The measurement stage may move beneath the projection system PL when the substrate support WT is away from the projection system PL.

In operation, the radiation beam B is incident on the patterning device MA, which is held on the mask support structure MT, and is patterned by the patterning device MA. Having traversed the patterning device MA, the radiation beam B passes through the projection system PL, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B at a focused and aligned position. Similarly, the first positioning device PM and another position sensor (which is not explicitly depicted in FIG. 1) can be used to accurately position the patterning device MA with respect to the path of the radiation beam B.

In general, movement of the object tables MT and MW may be realized with the aid of a long-stroke module (coarse positioning) and a short-stroke module (fine positioning), which form part of the positioning device PM and PW. Patterning device MA and substrate W may be aligned using mask alignment marks M1, M2 and substrate alignment marks P1, P2.

The depicted apparatus may for example be used in a scan mode, in which the support structure MT and the substrate table WT are scanned synchronously while a pattern imparted to the beam PB is projected onto a target portion C (i.e., a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion. The scanning direction is conventionally referred to as the y-direction of the lithographic apparatus.

A sensor S is provided on the substrate table WT of the lithographic apparatus. The sensor S is configured to measure aberrations in the radiation beam projected by the projection lens PL (which may also be referred to as the projection system), for example due to lens heating. The sensor S may for example comprise an imaging array (e.g., a CCD array) located a few millimetres below a diffraction grating (e.g., comprising several hundred lines). An object marker (not shown) which may for example consist of a few lines printed within a pinhole is provided on the projection system PL, for example on a lens of the projection system PL. For clarity, the term lens may represent a mirror, as explained above. In order to perform a measurement of the aberrations caused by the projection system PL, the projection system PL forms an image of the object marker at the substrate table WT. The sensor S is positioned beneath the projection system PL to capture the far field image of the object marker. The sensor S may comprise an imaging array (e.g., CCD array) which is sufficiently large to capture an image along the entire x-direction extent of the exposure slit. Where this is the case a set of object markers may be spaced apart along the x-direction of the exposure slit. Alternatively or additionally, the object markers may be located along the y-direction of the exposure slit. A series of object marker images may be captured at different positions relative to the XY plane (i.e., different xy-direction positions using the Cartesian coordinates shown in FIG. 1). The images may then be analysed by a processor PR to provide measurements of the aberrations which have been introduced into the radiation beam PB by the projection system PL.

A controller CT is configured to adjust one or more lens elements of the projection system PL in order to correct the aberrations caused by the projection system PL. Several of the lenses of the projection system PL may be provided with manipulators which are configured to modify the shape, position and/or orientation of those lenses. The lens manipulators may for example be mechanical actuators that apply compressive or stretching force to edges of a lens or may for example be heaters that are configured to selectively heat parts of a lens. The effect of modifying the lens shapes, positions, and orientations using the manipulators is well-known and thus the lens manipulators can be used to correct the aberration introduced by the projection system PL in a known way. The lens adjustments and the aberrations may be considered to have a linear relationship.

The sensor S, processor PR, controller CT and manipulators of the optical components (also referred as lens manipulators) comprise a feedback loop, which may be used to generate and apply a correction to the lithographic apparatus and/or process. The processor and/or controller may use a lens heating model.

The exposure system and a lens heating model may be described using a linear time invariant state space system. The exposure system can (in some non-limiting examples) be described as:

$$\dot{x}=Ax+Bu+w,$$

$$Z=Cx+Du+F^{-1}a+v,$$

wherein x is the state of the system, in particular temperature, A, B, C and D are system matrices and form the linear time invariant state space system, u indicates inputs, such as radiation dose, transmission, reflection, etc., Z indicates measured aberrations caused by lens heating, $F^{-1}$ is a transformation matrix that transforms an adjustment a into a correction, v is measurement noise, and w is process noise.

The noise sequences are assumed to be zero-mean white-noise (constant power spectrum) signals that are uncorrelated to the inputs. Advantageously, the lens heating model may be used as a predictor to predict aberrations associated with the projection system PL, whereby noise can be effectively filtered out. The filtering (noise reduction) may be achieved by applying a Kalman filter together with the lens heating model and/or by fitting mode shapes (although other forms of filter may be used). The Kalman filter for a system of the type is generally used to optimally observe the states of the system through its measured inputs and outputs, where the real system is known (system matrices given). Here, optimal means that it gives a zero-mean estimate with minimal variance. Information relating to the Kalman filter may be found in M. Verhaegen and V. Verdult, *Filtering and System Identification*, Cambridge University Press, 2007, Cambridge Books Online.

The lens heating model can be described as:

$$\dot{\hat{x}}=\hat{A}\hat{x}+\hat{B}u,$$

$$y_c=\hat{C}\hat{x}+\hat{D}u-F^{-1}a,$$

wherein $\hat{x}$ is the state of the model, in particular temperature, $\hat{A}, \hat{B}, \hat{C}$ and $\hat{D}$ are estimates of the real system matrices using system identification, u indicates inputs, such as radiation dose, transmission, reflection, etc., $y_c$ is the lens heating prediction minus the corrections applied by alignment strategies $y_a$, and $F^{-1}$ is a transformation matrix that transforms an adjustment a into a correction $y_a$.

The lens heating model is used to determine aberrations associated with the projection system PL (or at least one of the optical components: lens and or mirror). In order to correct the effects of an aberration an adjustment a is applied. This adjustment a is calculated by:

$$a=F(z+y_c).$$

The lens heating model is a linear time invariant (LTI) model. The signal generating system, e.g., a measurement setup that measures the deformation of an optical component caused by heating of the optical component, can be expressed as a linear time invariant model in state space form in the following way:

$$x(k+1)=Ax(k)+Bu(k)+w(k), \tag{1}$$

$$y(k)=Cx(k)+Du(k)+v(k), \tag{2}$$

where x is the state vector (i.e., a vector indicative of the state of the lens heating), u is a vector which represents inputs such as radiation dose, transmission, reflection, etc., y is a vector, which represents the output (i.e., the aberrations caused by the lens heating), w represents process noise, v represents measurement noise, and k is a sample index. The noise sequences are assumed to be zero-mean white-noise (constant power spectrum) signals that are uncorrelated to the inputs.

Figure 2:
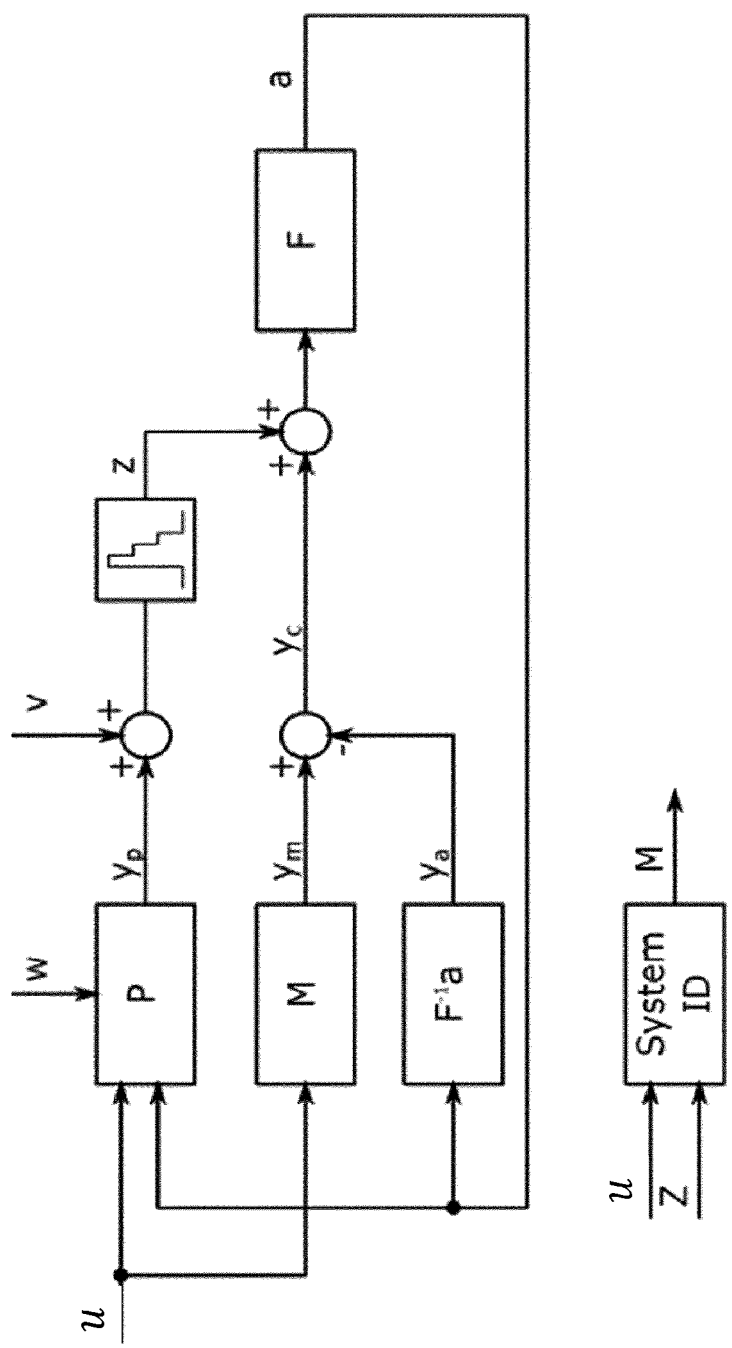
FIG. 2 shows a control scheme of an example of a control strategy using a lens heating model, consistent with embodiments of the present disclosure.

FIG. 2 shows a control scheme of the control strategy for lens heating compensation using a lens heating model M as a predictor to predict aberrations $y_m$. The lens heating model uses at least one mode shape to describe the relationship between inputs u, in particular inputs having effect on the heating and/or cooling of the optical component and resulting aberrations.

It is desirable to capture in the lens heating model all the effects of influences on the lens. In addition, it is desirable to capture all the effects of influences on the measurement setup. In other words, effects on measurement values, which arise from the way in which the measurement is performed rather than from aberrations caused by the lens heating, for example, noise w and/or v as described above.

Data which may be used as inputs u comprises, but is not limited to:

Polarization Shaping Element (PSE) and Polarization Changing Element (PCE)—These elements may be part of the illumination system and may be used to apply polarization effects to the radiation beam before it is incident upon the mask MA and/or projection system PL.

Wafer stage identifier (ID)—In a dual stage lithographic apparatus, one wafer stage supports a substrate being measured whilst the other supports a substrate being exposed. These stages carry the number 1 or 2 as ID. Each wafer stage may have its own sensor used in the measurement setup to measure the lens state description.

Lens identifier (ID)—Any lens used in the lithographic apparatus will have defining characteristics. These characteristics may comprise for example the area and/or material of the lens. In case of a reflective element, which may be represented by the 'lens', the characteristics may comprise reflectance.

Reticle identifier (ID)—Reticles used in the lithographic apparatus will also have defining characteristics, such as the pattern provided on the reticle.

Inner and outer sigma—As mentioned further above, inner and outer sigma, signify the inner and outer radius of the illumination pupil used.

Lens pressure and over-pressure—These inputs concern the pressures of gas around the at least one optical component (e.g., a lens).

Lens temperature—This input gives the temperature of the projection system PL and/or the individual optical components.

Dose and object characteristics—The amount of energy supplied to the projection system PL may be dependent on the dose supplied by the radiation source SO. The amount of energy supplied to the projection system PL may be dependent on the amount of light transmitted or reflected by (optical) objects in the lithographic apparatus, for example the mask and/or the projection system PL. The dose may for example have a range of 3-50 mJ/cm$^2$. The transmission (or reflection) of the objects has a value between 0% and 100%, for example, 70%. The object characteristics, like transmission and reflection of the optical object, may be generalized as optical parameter of the object.

Power—The power of radiation applied to the projection system PL from the illumination system IL is a combination of the dose of radiation, the transmission (or the reflection) of the reticle, and the area that is illuminated by the radiation.

Inputs may be known and/or may be quantities regarding the lithographic apparatus and/or process. For example, a known input may be the transmission of a lens element, or reflection of a mirror, in the lithographic apparatus. Transmission of a lens element and reflection of a mirror may be generalized as optical parameter on an optical component. Inputs may also include a field size. Inputs may also include correspondences between locations on the reticle and corresponding target portions of the wafer so that it. Alternatively or additionally, an input may be a measured quantity regarding the lithographic apparatus and/or process. Measured quantities may be recorded for example by using sensors in the lithographic apparatus. For example, an aberration measurement data set may be generated by exposing substrates using a variety of different exposure settings. Aberration measurements may be performed periodically (e.g., after exposure of each substrate, after exposure of each lot of substrates, or after some other interval). Alternatively, inputs may comprise simulated data that is generated by, for example, a FEM model, a ray tracing model, thermo-mechanical model, or a combination of modelling techniques. These models can be used to create a data set with inputs and associated aberration outputs.

On the basis of the at least one input, the lens heating model is configured to predict aberrations. These predicted aberrations can be used to calculate a correction a of the lithographic apparatus and/or process. A correction is provided such that the alignment of the substrate W is improved and hence aberrations detrimental to performance aspects, such as overlay or focus, are mitigated. A correction provided by the control system CT may be applied in any suitable way to improve the overlay performance of the lithographic apparatus. A correction may comprise altering the positioning of the substrate W with respect to the projection system PL, and/or the manipulation of one or more optical components in the projection system PL, and/or the positioning the substrate table WT with respect to the projection system PL and mask MA.

A correction may for example be applied before a batch of substrates W, and/or between two subsequent substrates W of such batch being processed in the lithographic apparatus. Additionally or alternatively, a correction may be applied during the projection of a patterned radiation beam B onto a substrate W. In addition, a correction may be applied between exposing a first area of a substrate W and a second area of the substrate W.

It is worth to note that although correction of the alignment of the substrate W with respect to the projection system PL provides a suitable way to correct the effect of aberrations on the overlay performance of the lithographic apparatus, any other way of improving the imaging performance may also be applied. For example, the calculated correction may be used to adjust the parameters of at least one optical component of the projection system PL to improve the imaging performance on the basis of predicted aberrations from a lens heating model. Also, the lens heating model may be used to predict aberrations that have a negative effect on the focus performance of the lithographic apparatus, in particular aberrations with an effect in a z-direction perpendicular to a main plane of the lens. By calculating and applying a correction in the lithographic process on the basis of the predicted aberrations in the z-direction, the effects of the actual aberration on the imaging performance, can at least partially be compensated therewith improving imaging performance, in particular focus performance in the lithographic process.

A system identification method is used to find system matrices A, B, C and D, the initial state of the system $x_0$, and the joint covariance matrix:

$$E\left[\begin{bmatrix} v(k) \\ w(k) \end{bmatrix} [v(j)^T w(j)^T]\right] = \begin{bmatrix} R & S^T \\ S & Q \end{bmatrix}, \quad (3)$$

where R is the co-variance matrix for the outputs, Q is the co-variance matrix for the states, S signifies the coupling between the different states and outputs, and j and k are sample indices. The initial state $x_0$ is used during validation of the model to compare the predictions of the model with measured data. The joint covariance matrix is applied when the lens heating model is used to calculate an observer, e.g., used to calculate Kalman gains. Calculation of the Kalman gains is advantageous for noise reduction. For example, in some instances the noise v may be so large that it causes an adjustment of the projection system PL, which increases the aberrations caused by the projection system PL. This is undesirable because it reduces the accuracy with which a pattern will be projected onto a substrate by the projection system PL.

System identification methods, for example subspace identification methods, can be used to identify the model. Subspace identification methods are based on the fact that, by storing the input and output data in structured block Hankel matrices, it is possible to retrieve certain subspaces that are related to the system matrices of the signal generating system. With these methods, estimates are found of the real system matrices A, B, C and D, up to an unknown similarity transformation T. Since the similarity transformation T is unknown, the following system matrices are estimated:

$$A_T = T^{-1}AT, B_T = T^{-1}B, C_T = CT, D_T = D. \tag{4}$$

Estimating these parameters results in a black-box model representing the internal workings of the model. The model does not have to represent the actual physical effects.

The A, C matrices and the joint covariance matrices may be calculated using Canonical Variate Analysis (CVA). The CVA may be implemented in the manner described in V. Overchee and B. Moor, *Subspace identification for linear systems*. Kluwer Academic Publishers, Dordrecht, Holland, 1996. Other methods may also be used to calculate the A, C matrices and the joint covariance matrix, for example Multivariable Output-Error State-sPace (MOESP) or Numerical algorithm for Subspace IDentification (N4SID). The MOESP algorithm may be implemented in the manner described in M Verhaegen and V. Verdult, *Filtering and System Identification*. Cambridge University Press, 2007. Cambridge Books Online. The MOESP provides results which are very similar to results obtained using the CVA method. Alternatively other methods such as output error methods (OE) or prediction error methods (PEM) can be used.

The B and D matrices are also calculated. A first method of performing this calculation is based on the fact that the output can be expressed linearly in the matrices B, D and the vector $x_0$ as $$\hat{y}(k) = CA^k x_0 + (\Sigma_{\tau=0}^{k-1} u(\tau) CA^{k-\tau-1}) vec(B) + (u(k)^T \otimes I_l) vec(D), \tag{5}$$

where l is the number of outputs, $\otimes$ is the Kronecker product and the vec operator stacks all the columns of a matrix on top of each other to form a new vector. This linear expression makes it possible to use a least squares method to minimize the error:

$$\min_{x_0, B, C} \frac{1}{N} \sum_{k=0}^{N-1} \|y(k) - \hat{y}(k)\|_2^2, \tag{6}$$

where $\hat{y}(k)$ is the prediction of the model with the already estimated A and C matrices.

A second method extracts the B and D matrices from a part of RQ factorization used in the calculation of A and C (RQ factorization is a standard factorization technique in linear algebra and is thus not described here). This method is described in V. Overchee and B. Moor, *Subspace identification for linear systems*. Kluwer Academic Publishers, Dordrecht, Holland, 1996, and is also described in M Verhaegen and P. Dewilde, "*Subspace model identification part 1. the output-error state-space model identification class of algorithms,*" International journal of control, vol. 56, no. 5, pp. 1187-1210, 1992. By applying this method, the use of Equation (5) is avoided, which significantly may, in certain cases, improve numerical performance for a large dataset. However, this method does not take the initial state $x_0$ into account, and this may be the cause of less accurate calculation of B and D in comparison with the other method of calculating B and D.

These inputs may be used for the identification procedure used to identify the lens heating model. The data set used to generate the lens heating model may be obtained during operation of the lithographic apparatus. The data set may be generated by exposing substrates using a variety of different exposure settings. Aberration measurements may be performed periodically, for example, after exposure of each substrate, after exposure of each lot of substrates, or after some other interval. Alternatively, a FEM model, a ray tracing model, a thermo-mechanical model, or a combination of modelling techniques may be used to create a data set with inputs and associated aberration outputs.

The identification of the lens heating model based on an input data set may be an iterative process. As an example, the steps of a single iteration are:

Pre-processing. The data may be optimized by removing trends and offsets, to avoid identifying poles on the unit circle or on the origin. Input sequences may be normalized to avoid having to solve ill-conditioned matrices in the subspace identification methods.

Mode Shape Selection. At least one mode shape is selected to represent a relationship between at least one input in the lithographic process and a resulting aberration. Mode shape selection is described in more detail below. The mode shape may be selected every iteration. Alternatively, the mode shape may be pre-determined, and the same mode shape used for multiple iterations.

Identification. The model is fitted to the data through the use of system identification.

Validation. The model is validated by analysing how well the identified model caught the dynamics from the dataset. One way in which this may be done is by using a metric referred to as Variance Accounted For (VAF), which may be expressed as follows:

$$VAF(y(k), \hat{y}(k)) = \max\left(0, \left(1 - \frac{\frac{1}{N}\sum_{k=1}^{N}\|y(k) - \hat{y}(k)\|_2^2}{\frac{1}{N}\sum_{k=1}^{N}\|y(k)\|_2^2}\right)\right) \cdot 100\%, \tag{7}$$

where y is the measured aberration, $\hat{y}$ is the predicted signal, k is the sample index and N is the number of samples. The VAF has a value between 0% and 100%, the higher the VAF the lower the prediction error and the better the model. The VAF compares the lens heating state as predicted by the lens heating model with the actual measured lens heating state. By looking at the VAFs of the output from the model, a statement may be made about over-fitting and also about the ability of the model to predict unknown inputs. The validation also looks at residuals, which are calculated as:

$$e(k) = y(k) - \hat{y}(k), \tag{8}$$

where y(k) is the measured output and $\hat{y}(k)$ is the output generated by the model. Checking the cross-correlation of the residual to the inputs indicates whether there are any dynamics that were not caught by the model. This could be an indication that the model was under-fitted, i.e., not all lens heating dynamics are captured by the model. In addition, an auto-correlation of the residuals may be performed to see if there are any other dynamics left in the signal. This could be the result of an influence from an input which has not been provided to the model, or the result of a nonlinear effect. The validation tests are based on the properties:

The sequence e(k) is a zero-mean white-noise sequence, if the identified model explains all the dynamics in y(k).
The sequence e(k) is statistically independent from the input sequence u(k), if all relations between u(k) and y(k) are captured in the identified model.

The above cycle may be iterated a plurality of times (e.g., several times) in order to obtain a lens heating model, which satisfactorily captures the dynamics from the data set. In other words, iterations of the cycle are performed until the output from the model reflects sufficiently accurately the aberrations, which are caused by the lens heating. That is, until the model correlates the inputs to the measured aberrations sufficiently accurately.

To identify a correct model of a system, the data set must contain enough information about the system. For this reason, the data must have been recorded when the system was excited. This is referred to as persistency of excitation.

A check for persistency of excitation may be performed using a Hankel matrix of the inputs to the system. The A and C matrices are extracted from part of the space of this matrix, i.e., a subspace is extracted from the Hankel matrix. To ensure that this subspace can be extracted, a Hankel matrix of the inputs can be used, which has an order of at least n+s*2, where n is the model order and s the number of rows in the Hankel matrix. If this is the case, then the system is excited enough to make correct estimations of the system. The Hankel matrix for the input u is constructed as follows:

$$U_{i,s,N} = \begin{bmatrix} u(i) & u(i+1) & \ldots & u(i+N-1) \\ u(i+1) & u(i+2) & \ldots & u(i+N) \\ \vdots & \vdots & \ddots & \vdots \\ u(i+s-1) & u(i+s) & \ldots & u(i+N+s-2) \end{bmatrix}, \quad (9)$$

where N is the number of input samples. The model orders (n) used in the identification cycle in conventional systems vary between 1 and 8 (although values larger than 8 are possible).

The processing (noise reduction) may be achieved by applying a Kalman filter together with the lens heating model (although other forms of filter may be used in other arrangements). The Kalman filter for a system of the type set out in Equations (1) and (2) is generally used to optimally observe the states of the system through its measured inputs and outputs, where the real system is known (system matrices given). Here, optimal means that it gives a zero-mean estimate with minimal variance. Moreover, because the signal generating system is assumed to be time-invariant, the Kalman filter is stationary and can be expressed as a gain K, also referred to as the Kalman-gain. Information relating to the Kalman filter may be found in M. Verhaegen and V. Verdult, *Filtering and System Identification*. Cambridge University Press, 2007. Cambridge Books Online.

The following model, which may be referred to as an innovation predictor model, is used:

$$\hat{x}(k+1)=A\hat{x}(k)+Bu(k)+K(y(k)-C\hat{x}(k)-Du(k)), \quad (11)$$

$$\hat{y}(k)=C\hat{x}(k)+Du(k), \quad (12)$$

in which $\hat{x}$ is the state vector, u indicates inputs to the model (discussed above), y is the measured lens state descriptor (i.e., measured aberrations which may be expressed as one or more mode shapes), $\hat{y}$ is the lens state descriptor output from the model (i.e., estimated aberration), k is the sample index, and K is the Kalman-gain of the system.

Equation (11) describes how the state vector is updated by the model using the measured aberration. Thus, the state of the projection system (or at least one optical component of the projection system) is determined by the model, including using the measured aberration as an input. Equation (12) describes how the state vector is translated into estimated aberration. Thus, the innovation predictor relates the lens heating model state to the estimated aberration $\hat{y}$. The aberrations may be described in terms of one or more mode shapes.

Using the estimated joint covariance matrix, Equation (3), the Kalman-gain can be calculated by solving the Discrete Algebraic Riccati Equation (DARE)

$$P=APA^T+Q-(S+APC^T)(CPC^TCT+R)^{-1}(S+APC^T)^T, \quad (13)$$

$$K=(S+APC^T)(CPC^TC+R)^{-1}, \quad (14)$$

where P is the variance on the error between the real state and the estimated state through the predictor model. A and C are the system matrices which follow from the identification process. Q, S and R are elements of the joint covariance matrix.

The innovation predictor model based on the lens heating model from Equations (11) and (12) may be used with the calculated Kalman-gain to reduce noise on the projection system PL state description. Processing the measured aberration values using the model and the Kalman-gain provides estimated aberration values with reduced noise. This may be referred to as a lens heating model noise filter.

A perfect waveform propagates with a spherical wavefront. Lens heating and/or cooling may lead to an aberrated waveform in the radiation beam, that is a waveform with a wavefront that is non-spherical. An aberrated waveform can be described mathematically. Using a mathematical description of an aberrated waveform, the lens heating model may predict how an aberrated waveform changes with time.

The process of describing a waveform in mathematical notation may also be known as decomposition. A waveform may be described in a number of ways, for example in terms of mode shapes. That is, the aberrated waveform may be decomposed into mode shapes.

The mode shapes represent spatial relations in the optical component, making it possible to estimate the aberrations at each location of interest of the optical component by only knowing the aberration in a small part of the optical component. The mode shape may for example be described as a normalized vector with each entry representing an aberration for a certain position on the optical component. The mode shapes may be orthogonal.

The mode shapes can be fitted to the projection system PL alignment measurements by projection of the projection system PL alignment measurements onto the mode shapes. The decomposition of a projection system PL alignment measurement into mode shapes is as follows:

$$Z(t)=\Sigma_i^N U_i \eta_i(t),$$

where Z(t) is the aberrated waveform at a time t; $U_i$ is the $i^{th}$ mode shape; $\eta_i(t)$ is the modal amplitude of the $i^{th}$ mode shape, describing the spatial, temporal and/or dynamical evolution of the $i^{th}$ mode shape; and N is the maximum number of mode shapes used. Any number of mode shapes, that is any number of indices i, may be used to describe the aberrated waveform. That is, N is an integer in the range 1 to ∞. N may be chosen depending on the required application.

The number of mode shapes required to provide a robust fit may be referred to as dominant mode shapes. FIG. 2 shows examples of dominant mode shapes related to lens heating. The grayscale is to be construed in such a way that the magnitude of the aberration at the top is positive and the magnitude of the aberration at the bottom is negative in the z direction.

The mode shape or shapes can be obtained on the basis of sensor data and/or simulation data. The simulation data may for instance be generated by a finite element model (FEM), a ray tracing model, a thermo-mechanical model, or a combination of modelling techniques describing a relationship between lens heating input parameters and aberrations caused by the lens heating caused by these input parameters.

In the case of sensor data being used for obtaining mode shapes, measurements may be performed, for example lens alignment measurements. This results in a dataset; $\{M\}^N$, where N signifies the number of samples. By making a matrix $\{M\}^N$, where every vector $M_N$ describes the measurements at a single time instance, Singular Value Decomposition (SVD) may be applied. The mode shapes can then be extracted from the decomposition as follows:

$$[M_1 ... M_N] = [U_1 ... U_N] \begin{bmatrix} \sigma_1 & 0 & 0 \\ 0 & \ddots & 0 \\ 0 & 0 & \sigma_N \end{bmatrix} V^T,$$

wherein $U_i$ are mode shapes, $\sigma_i$ are singular values, and V eigenvectors. The singular values and eigenvectors describe the modal amplitude $\eta_i(t)$, that is the temporal and/or dynamical evolution of each mode shape. It is remarked that although a single time instance is imposed in determination of the matrix $\{M\}^N$, the whole measurement layout may actually not be measured at the same time.

At least one mode shape may be selected and used in a control system. For example, the control system may also comprise the lens heating model as described above. Using system identification, the mode or modes may be fitted to aberration data to represent a relationship between an input and an aberration. A set of mode shapes may be predetermined (e.g., prior to using a lithographic apparatus for production) based on processing a first number of object markers as described above. During production, a smaller subset of those object markers may be measured in order to select a linear combination of mode shapes that are present at a given moment in time.

According to some embodiments, using a number of mode shapes in the range of one to twenty can be advantageous. That is, using one to twenty mode shapes provides a robust fit for lens heating and/or cooling in most lithographic applications. Using one to twenty mode shapes reduces overfitting. When fitting using mode shapes, a relatively small number of parameters, e.g., four parameters, are fitted for each mode shape. For example, if using twenty mode shapes, eighty parameters (20×4) are fitted. Other numbers of parameters may be fitted per mode shape. For example, seven parameters may be fitted per mode shape, which may be helpful to model fading, for example.

In an alternative method, aberrated waveforms are described using Zernike polynomials. In this alternative method, a number of Zernike coefficients may be used to describe the aberrations. Aberrations in simple optical elements, for example a glass slide or a reticle, may be represented in terms of a few Zernike orders. Aberrations in lenses, however, may give rise to complex aberrations, for example due to the fact that lenses are not flat planar objects but vary in thickness. As such, if using Zernike polynomials to describe the aberrations in lenses, higher order Zernike coefficients can be used to fully describe the aberrations. For example, Zernike coefficients $Z_2$ to $Z_{25}$ of the field orders offset, tilt, curvature, and third order may be used. Thus, the aberration fitting has 96 parameters (24×4). Alternatively, Zernike coefficients $Z_2$ to $Z_{64}$ may be used, thus the fitting has 256 parameters (64×4). A large number of parameters may result in overfitting. As such, using mode shapes is advantageous as it reduces the number of parameters and hence leads to reduced overfitting.

An advantage of describing aberrations using mode shapes is that it results in a reduced computational load and hence reduced computational time. In alternative lens heating correction processes, the computational time is long due to the large number of parameters required to provide an accurate description of lens heating. The reduced computational time accorded by fitting mode shapes allows for real time corrections of the lithographic apparatus to be performed, for example during exposure of a substrate. Additionally and/or alternatively, the reduced computational time accorded by fitting mode shapes represents an improvement in throughput and/or reduced requirement for computational resources in lithographic processing. This in turn may result in a cost saving associated with lithographic processes. For example, when an increased throughput of manufactured goods is achieved, or when fewer computational resources are required.

It is noticed that the use of a model, which describes a relationship between another physical phenomenon caused by known input parameters and a resulting aberration at a location of interest of at least one optical component, may also be used to predict an aberration of the at least one optical component at the location of interest in order to use the estimated aberration to correct alignment of the optical component. Thus, it is concluded that by using mode shapes, the aberrations caused by lens heating can be predicted more accurately over the whole field of the optical component, i.e., at a location of interest on the optical component.

In a conventional method of correcting for lens heating, a set of aberration measurements are performed by using alignment marks and the sensor S as described above. Typically, aberration is measured at alignment marks along the x-axis, for example with seven object markers. The aberrations measured at the alignment marks are used to fit Zernike polynomials to the aberrations. The polynomials are then used to interpolate aberrations over the whole field of the projection system PL, based on the alignment measurements along the x-axis. Interpolation may lead to errors, especially when considering off-axis aberrations. To improve the results of this alternative method, additional alignment measurements may be used, for example by providing additional alignment marks along the x-axis and the y-axis. However, the use of these additional alignment measurements has a negative impact on the throughput of the lithographic apparatus, since the additional alignment marks require additional measurement time to measure aberrations at the respective additional alignment marks. The use of additional alignment marks also increases the occurrence of overfitting.

In some embodiments, using mode shapes additionally provides an improved method for correcting for aberration in two axes. As selected mode shapes describe the evolution of an aberration in three dimensions, the aberration at any location of interest on the projection system PL can be determined more accurately and/or more efficiently. As a result thereof, the additional alignment measurements to improve aberration estimation are no longer required in order to obtain a substantially corresponding improved performance. This may have a substantially positive effect on the throughput of the lithographic apparatus. Additionally or alternatively, projection system PL alignment accuracy can be improved by using the additional alignment measurements. If additional alignment measurements are used in combination with mode shapes, the computational complexity and/or overfitting is less disadvantageous compared to conventional methods, due to the smaller number of parameters fitted.

Using mode shapes according to the described embodiments, a smaller number of parameters are fitted, which reduces the chance of overfitting. It has been found that, for most lithographic applications, twenty mode shapes or fewer (N≤20) can describe the majority of aberrations caused by lens heating and/or cooling. The selected number of mode shapes will depend on the lithographic application. For example, twenty mode shapes may be selected for apparatus with complex lens heating profiles. In other applications cases, fewer mode shapes may be selected to advantageously priorities reduced overfitting, reduced processing time, and/or reduced computational load.

Figure 3:
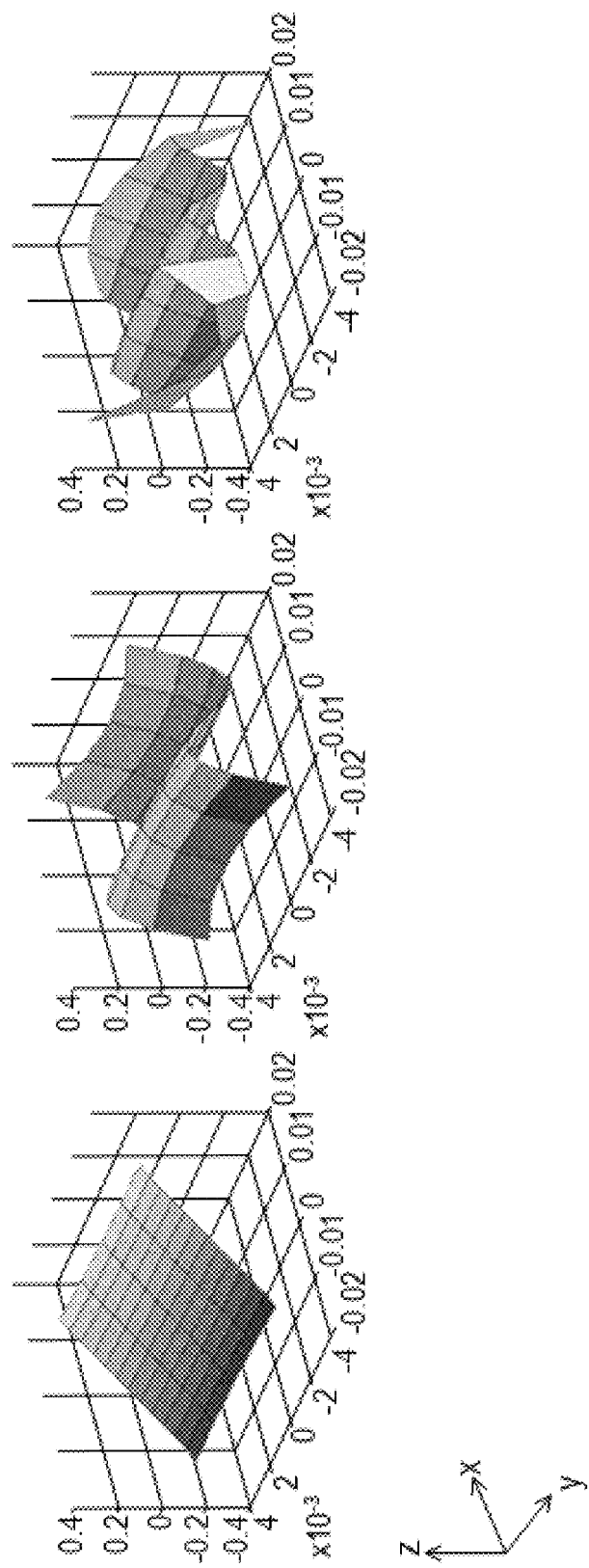
FIG. 3 shows three examples of mode shapes related to lens heating for a lithographic application, consistent with embodiments of the present disclosure.

FIG. 3 illustrates three mode shapes that may form a selection for a lithographic application to be used in the model as described above. That is, these mode shapes may be used to describe the lens heating effect induced by the radiation interaction with the projection system PL of the lithographic apparatus LA.

Figure 4:
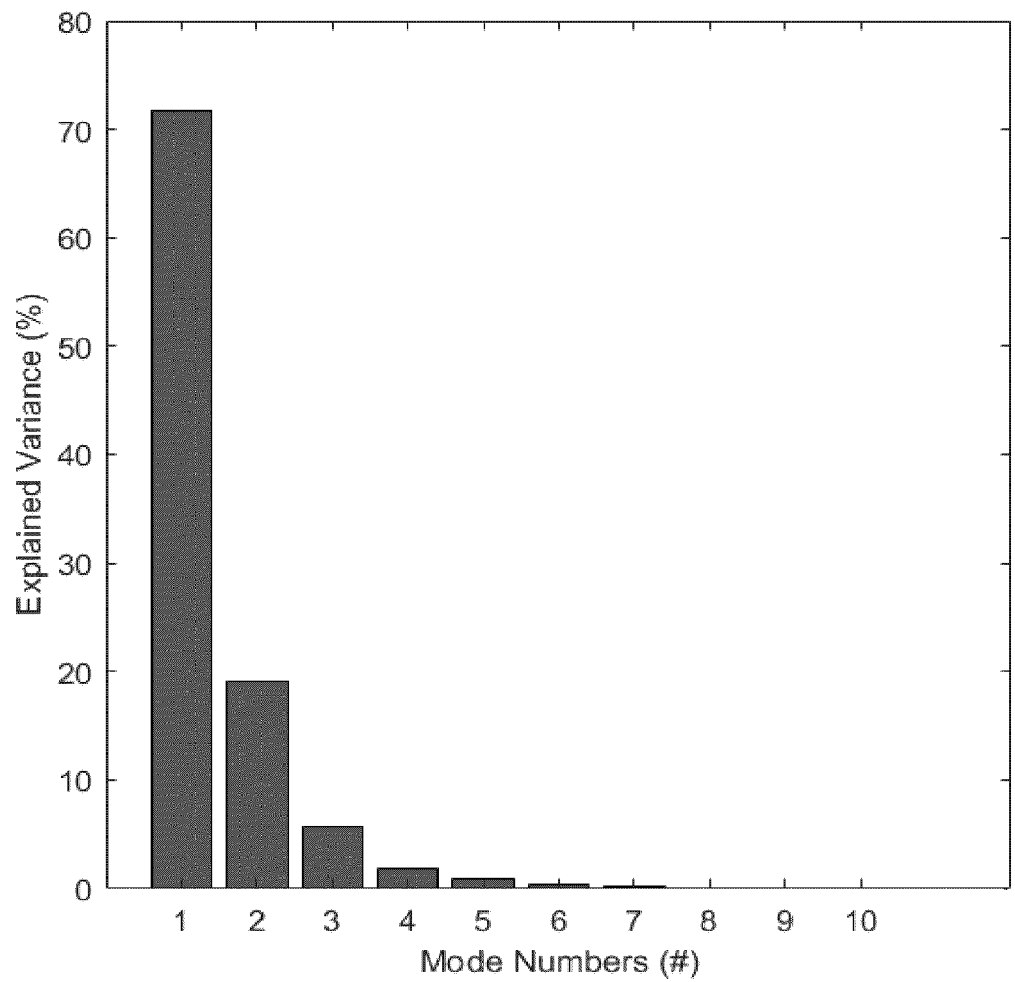
FIG. 4. shows the contribution of mode shapes towards the effects of lens heating for a lithographic apparatus, consistent with embodiments of the present disclosure.

FIG. 4 shows the relative importance of ten dominant mode shapes for a lithographic application. Aberration in this lithographic application is a result of many factors, for example inputs such as lens type and/or radiation dose. FIG. 4 depicts the contribution of each mode shape to the overall variance of the signal. That is, how much of the measured aberration can be explained by each mode. The contribution is deduced from the singular values, calculated as described above, and scaled by:

$$\text{explained variance} = \frac{\sigma_i}{\sum_1^N \sigma_i},$$

where $\sigma_i$ are the singular values, and N=10.

As illustrated by FIG. 4, using a less than ten modes robustly accounts for the measured aberrations. For example, the first six or seven modes describe approximately all of the aberration. The first two modes describe about 90% of the aberration. The first mode alone describes over 70% of the aberration.

It will be appreciated by the skilled person that different lithographic applications and/or apparatus will have different aberration profiles and/or different requirements. Depending on the requirements of the lithographic process, a different number of modes may be selected. For example, for some processes fitting only using one mode shape may provide an adequate description of the aberration while advantageously reducing overfitting and/or increasing throughput and/or reducing computational requirements. For other processes, for example a process with more stringent overlay requirements, six or seven modes may be selected to provide a more detailed description of the aberration and hence apply an adequate correction. Alternatively, a number of mode shapes between one and six (or seven) may be chosen to optimise the correction according to the user's needs.

Figure 5:
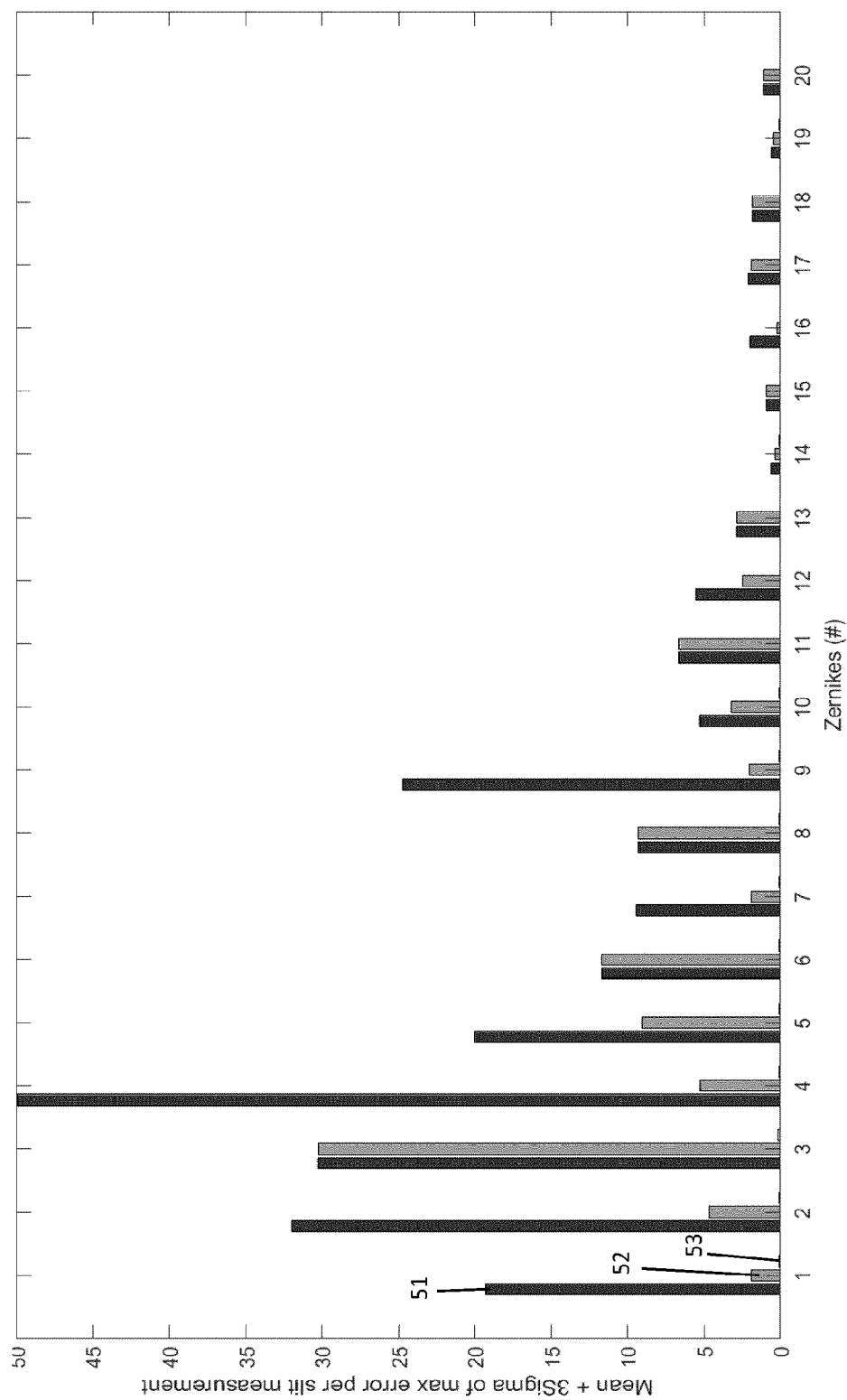
FIG. 5 shows data comparing the use of mode shapes compared to conventional methods of correcting for aberrations, consistent with embodiments of the present disclosure.

FIG. 5 shows measured data, wherein aberration correction using mode shapes is compared to alternative correction methods. To test the performance of the lithographic apparatus with regard reducing the effects of lens heating and/or cooling, aberrations may be measured after the correction has been generated and applied. The measured aberration is then decomposed into a sum of Zernike polynomials. The Zernike polynomials correspond to real aberrations and represent the residual aberrations after correction.

In the example as depicted in FIG. 5, six mode shapes are used to describe the relationship between inputs in the lithographic process and aberrations caused by lens heating and/or cooling. The alternative correction methods comprise: no correction, and a conventional correction method as described above, using Zernike coefficients $Z_1$ to $Z_{64}$.

The aberration of each order varies in amplitude across the image field. The maximum amplitude of residual aberration is plotted on the y-axis. The maximum amplitude varies depending on each aberration, i.e., each Zernike order.

For each Zernike order, three bars are shown. These correspond to, from left to right: maximum aberration with no correction for lens heating (51); maximum aberration with conventional corrections applied (52); and maximum aberration with corrections applied after fitting with six mode shapes (53). It worth noting that the third bar, corresponding to the use of mode shapes, is small in height as the residual aberration is close to zero. It can be seen that using mode shapes results in a large reduction in aberration compared to no correction and compared to the conventional method.

Interestingly, while this example uses only six modal shapes to represent the relationship between inputs in the lithographic apparatus and the aberrations, a reduced aberration can be seen at all Zernike orders up to order 20. This indicates that the selection of only six mode shapes provides a robust representation of measured aberration, even for high order aberrations. This improvement may be assigned to reduced overfitting.

Another advantage is that the mode shapes, as used in the lens heating model, may be predetermined. That is, a set of mode shapes may be determined associated with a specific lithographic application. The lens heating model can then be calibrated with this predetermined set of mode shapes depending on the required application. As a result, the lens heating model may be used interchangeably between different lithographic apparatuses. Additionally, calibration of the lens heating model for a specific application may only need to be carried out once in the lifetime of said application. These predetermined mode shapes may be selected in a variety of ways, for example based on modelling (e.g., FEM, ray tracing, thermo-mechanical or a combination of modelling techniques) and/or calibrated with real measurement data.

Once the dominant mode shapes have been determined for a particular lithographic apparatus and/or process, these may be used in a lens heating model for multiple iterations. For example, the dominant mode shapes may be determined in a calibration step. The pre-determined mode shapes may then be used in the control system to generate and apply a correction to the lithographic apparatus and/or process. This generation of a correction using pre-determined mode shapes may be repeated as required by the user, for example between subsequent wafers and/or between subsequent areas of the same wafer and/or in real time during an exposure. Using pre-determined mode shapes allows the process to be repeated multiple times without recalibration. Using pre-determined mode shapes may allow the process to be repeated for the entire lifetime of the apparatus without the need for recalibration. This provides an added advantage of increasing the throughput of lithographic processes as downtime associated with calibration may be reduced. Additionally, the predetermined mode shapes may be used interchangeably between machines with a similar apparatus and/or process, allowing for improved compatibility between lithographic apparatuses.

Hereinabove, the use of mode shapes to express aberrations caused by lens heating has been described. By using mode shapes to describe a relationship between aberrations and lens heating input parameters, such as radiation dose, transmission, reflection, cooling dose etc., the aberrations caused by lens heating at a location of interest on the projection system PL may be determined more accurately and/or more efficiently.

The use of mode shapes directly relates to a physical effect in the projection system PL. The improved accuracy of prediction of aberrations may for example be used to improve the overlay performance of the lithographic apparatus LA and/or to decrease the number of alignment mark measurements in order to improve the throughput of the lithographic apparatus LA. Hereinabove, the use of mode shapes has been described for use in a control system in order to generate and apply a correction to the lithographic apparatus LA to reduce the effects of lens heating and/or cooling. It is remarked that the mode shapes may also be used in other control system and/or models that directly or indirectly predict aberrations caused by inputs that cause lens heating or, more generally, inputs that relate to aberrations associated with the projection system PL.

While specific embodiments of the present disclosure have been described above, it will be appreciated that they may be practiced otherwise than as described.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that they may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

In the above description the terms "lens state" and "lens state description" are used. These may be considered to be examples of the more general "lithographic apparatus state" and lithographic apparatus state description". The lithographic apparatus state may include information which may be considered not to form part of the lens state (e.g., information relating to the position or identity of a substrate table).

It will be appreciated that aspects of the embodiments of the present disclosure can be implemented in any convenient way including by way of suitable hardware and/or software. For example, a device arranged to implement the embodiments may be created using appropriate hardware components. Alternatively, a programmable device may be programmed to implement the embodiments. The embodiments of the present disclosure therefore also provide suitable computer programs for implementing the features. Such computer programs can be carried on suitable carrier media including tangible carrier media (e.g., hard disks, CD ROMs and so on) and intangible carrier media such as communication signals.

Aspects of the embodiments of the present disclosure are set out in the clauses below.

CLAUSES

1. A lithographic apparatus comprising:
a projection system comprising at least one optical component and configured to project a pattern onto a substrate; and
a control system arranged to reduce the effects of heating and/or cooling of at least one optical component in a lithographic process, wherein the control system is configured to:
select at least one of a plurality of mode shapes to represent a relationship between at least one input in the lithographic process and an aberration resulting from the at least one input; and
generate and apply a correction to the lithographic apparatus based on the selected mode shape.

2. The lithographic apparatus of clause 1, wherein the at least one mode shape is selected from a predetermined set of mode shapes.

3. The lithographic apparatus of clause 1 or 2, wherein the control system selects twenty or fewer mode shapes to represent the relationship between the at least one input and the aberration resulting from the at least one input.

4. The lithographic apparatus of any of clauses 1 to 3, wherein the control system selects six or fewer mode shapes to represent the relationship between the at least one input and the aberration resulting from the at least one input.

5. The lithographic apparatus of any preceding clause, wherein the at least one input comprises a dose of radiation supplied by a radiation source, and/or transmissivity of an object used in the lithographic process, and/or reflectance of an object used in the lithographic process.

6. The lithographic apparatus of any preceding clause, wherein the lithographic apparatus further comprises a sensor configured to measure the aberration.

7. The lithographic apparatus of any preceding clause, wherein the control system is further configured to filter data from the at least one input.

8. The lithographic apparatus of any preceding clause, wherein the control system is calibrated using measurement data, input data, or data obtained from a model.

9. The lithographic apparatus of any preceding clause, wherein the correction is an adjustment of an alignment of a substrate with respect to the projection system and/or an adjustment of the at least one optical components of the projection system.

10. A method of reducing the effects of heating and/or cooling of at least one optical component in a lithographic process, the method comprising:
selecting at least one of a plurality of mode shapes to represent a relationship between at least one input in the lithographic process and an aberration resulting from the input; and generating and applying a correction to the lithographic process based on the mode shape.

11. The method of clause 10, wherein the at least one mode shape is selected from a predetermined set of mode shapes.

12. The method of clause 10 or 11, wherein twenty or fewer mode shapes are selected.

13. The method of any of clauses 10 to 12, wherein six or fewer mode shapes are selected.

14. The method of any one of clauses 10 to 13, wherein the at least one input in the lithographic apparatus comprises a dose of radiation supplied by a radiation source, and/or transmissivity of an object used in the lithographic process, and/or reflectance of an object used in the lithographic process.

15. The method of any one of clauses 10 to 14, wherein the method further comprises measuring the aberration using a sensor.

16. The method of any one of clauses 10 to 15, wherein the method further comprises filtering data from the at least one input.

17. The method of any of clauses 10 to 16, wherein the control system is calibrated using measurement data, input data, or data obtained from a model.

18. The method of any of clauses 10 to 17, wherein the correction is a correction of an alignment of a substrate with respect to the at least one optical component.

19. A non-transitory computer readable medium program comprising computer readable instructions configured to cause a processor to carry out the method of any one of clauses 10 to 18.

20. A device manufacturing method comprising producing an integrated circuit using the lithographic apparatus of any one of clauses 1 to 9.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
a projection system comprising at least one optical component and configured to project a pattern onto a substrate; and
a control system arranged to reduce the effects of heating and/or cooling of at least one optical component in a lithographic process, wherein the control system is configured to:
select at least one of a plurality of mode shapes, the mode shapes representing a relationship between at least one input in the lithographic process and an aberration resulting from the at least one input; and
generate and apply a correction to the lithographic apparatus based on at least one selected mode shape.

2. The lithographic apparatus of claim 1, wherein the at least one selected mode shape is selected from a predetermined set of mode shapes.

3. The lithographic apparatus of claim 1, wherein the control system selects twenty or fewer mode shapes to represent the relationship between the at least one input and the aberration resulting from the at least one input.

4. The lithographic apparatus of claim 1, wherein the at least one input comprises at least one of:
a dose of radiation supplied by a radiation source; or
a transmission of an object used in the lithographic process.

5. The lithographic apparatus of claim 1, wherein the lithographic apparatus further comprises a sensor configured to measure the aberration.

6. The lithographic apparatus of claim 1, wherein the control system is further configured to filter data from the at least one input.

7. The lithographic apparatus of claim 1, wherein the correction is an adjustment of at least one optical component of the projection system.

8. A method of reducing the effects of heating and/or cooling of at least one optical component in a lithographic process, the method comprising:
selecting at least one of a plurality of mode shapes, the mode shapes representing a relationship between at least one input in the lithographic process and an aberration resulting from the at least one input; and
generating and applying a correction to the lithographic process based on at least one selected mode shape.

9. The method of claim 8, wherein the at least one selected mode shape is selected from a predetermined set of mode shapes.

10. The method of claim 8, wherein twenty or fewer mode shapes are selected.

11. The method of claim 8, wherein six or fewer mode shapes are selected.

12. The method of claim 8, wherein the at least one input in the lithographic apparatus comprises at least one of:
a dose of radiation supplied by a radiation source; or
an optical parameter of an object used in the lithographic process.

13. The method of claim 8, further comprising measuring the aberration using a sensor.

14. The method of claim 8, wherein further comprising filtering data from the at least one input.

15. The method of claim 8, wherein the applied correction is a correction of an alignment of a substrate with respect to the at least one optical component.

* * * * *